United States Patent
Kurita et al.

(10) Patent No.: US 8,421,557 B2
(45) Date of Patent: Apr. 16, 2013

(54) CHIP-TYPE SOLID ELECTROLYTIC CAPACITOR AND CHIP-TYPE FILTER

(75) Inventors: Junichi Kurita, Osaka (JP); Hiroshi Higashitani, Osaka (JP); Tsuyoshi Yoshino, Kyoto (JP)

(73) Assignee: Panasonic Corporation, Osaka (JP)

( * ) Notice: Subject to any disclaimer, the term of this patent is extended or adjusted under 35 U.S.C. 154(b) by 541 days.

(21) Appl. No.: 12/678,529

(22) PCT Filed: Nov. 12, 2008

(86) PCT No.: PCT/JP2008/003269
§ 371 (c)(1),
(2), (4) Date: Mar. 17, 2010

(87) PCT Pub. No.: WO2009/063618
PCT Pub. Date: May 22, 2009

(65) Prior Publication Data
US 2010/0214038 A1    Aug. 26, 2010

(30) Foreign Application Priority Data

Nov. 15, 2007  (JP) ................................. 2007-296521
Nov. 15, 2007  (JP) ................................. 2007-296522

(51) Int. Cl.
*H03H 7/01*    (2006.01)
*H01G 4/06*    (2006.01)

(52) U.S. Cl.
USPC .......................................... 333/185; 361/524

(58) Field of Classification Search .................. 333/168, 333/175, 176, 185; 361/301, 3, 301.4, 303, 361/525, 528, 529, 524, 532, 533, 541
See application file for complete search history.

(56) References Cited

U.S. PATENT DOCUMENTS

| | | | |
|---|---|---|---|
| 2002/0015277 A1 | 2/2002 | Nitoh et al. | |
| 2002/0141141 A1 | 10/2002 | Nitoh et al. | |
| 2006/0120023 A1* | 6/2006 | Kobayashi et al. | 361/523 |
| 2006/0164792 A1 | 7/2006 | Ando | |
| 2006/0262487 A1 | 11/2006 | Kurita et al. | |

FOREIGN PATENT DOCUMENTS

| | | |
|---|---|---|
| JP | 2001-230156 | 8/2001 |
| JP | 2003-142347 | 5/2003 |
| JP | 2004-071634 | 3/2004 |
| JP | 2005-269293 | 9/2005 |
| JP | 2007-005760 | 1/2007 |

OTHER PUBLICATIONS

International Search Report issued Jan. 27, 2009 in International (PCT) Application No. PCT/JP2008/003269.
English translation for Japanese Patent Application Publication 2003-142347, published May 16, 2003.
English translation for Japanese Patent Application Publication 2005-269293, published Sep. 29, 2005.

* cited by examiner

*Primary Examiner* — Benny Lee
*Assistant Examiner* — Gerald Stevens
(74) *Attorney, Agent, or Firm* — Wenderoth, Lind & Ponack, L.L.P.

(57) ABSTRACT

A solid electrolytic capacitor is formed by stacking flat solid electrolytic capacitor elements. Negative electrode sections of a part of the solid electrolytic capacitor elements and negative electrode sections of the remaining part of the solid electrolytic capacitor elements are led out so as to be faced to each other, and are connected to the first and second negative electrode lead frames which are independent to each other, respectively. Two of negative electrode sections are insulated from each other in the solid electrolytic capacitor.

9 Claims, 12 Drawing Sheets

CHIP-TYPE SOLID ELECTROLYTIC CAPACITOR AND CHIP-TYPE FILTER

This application is a U.S. national phase application of PCT/JP2008/003269, filed Nov. 12, 2008.

TECHNICAL FIELD

The present invention relates to a chip-type solid electrolytic capacitor that employs a conductive polymer as a solid electrolyte and can be surface-mounted, among capacitors used for various electronic devices. The present invention also relates to a chip-type filter having the chip-type solid electrolytic capacitor as a basic structure.

BACKGROUND ART

An impedance characteristic in a region of a frequency higher than that of the conventional art has been demanded to be improved also in a capacitor as one of electronic devices as the frequency of the electronic devices has been increased. In order to respond to such demand, various solid electrolytic capacitors have been studied that employ a conductive polymer of high electric conductivity as a solid electrolyte.

Recently, a solid electrolytic capacitor used in a periphery of the central processing unit (CPU) of a personal computer or the like has been strongly demanded to be downsized and have large capacitance. Not only low equivalent series resistance (low ESR) responding to frequency increase, but also low equivalent series inductance (low ESL) excellent in noise reducing property and transient responsiveness has been strongly demanded. Also in order to respond to such demand, various studies have been performed.

FIG. 12A through FIG. 12D are a plan sectional view, a front sectional view, a bottom sectional view, and a bottom view showing a structure of a conventional chip-type solid electrolytic capacitor that has been proposed by the present inventors, respectively. This chip-type solid electrolytic capacitor has a plurality of solid electrolytic capacitor elements (hereinafter referred to as "elements") 21, positive electrode lead frames 25, negative electrode lead frame 26, positive electrode common terminals 27, negative electrode common terminal 28, and covering resin 29.

Each element 21 is produced using a positive electrode body made of valve action metal. First, the surface of the positive electrode body is roughened and a dielectric oxide film layer is formed thereon. Next, an insulated section (not shown) is disposed at a predetermined position of the positive electrode body to divide the positive electrode body into positive electrode section 22 and a negative electrode forming section (not shown). A solid electrolyte layer made of a conductive polymer and a negative electrode layer formed of a carbon layer and a silver paste layer are sequentially formed on the dielectric oxide film layer of the negative electrode forming section (all of them are not shown) in a stacking manner in this order. Thus, negative electrode section 23 is formed. In the above-mentioned procedure, element 21 is produced.

Laminated body 24 is structured by stacking elements 21 so that positive electrode sections 22 of elements 21 are arranged alternately in the opposite directions.

Positive electrode lead frame 25 integrally joins positive electrode sections 22 of laminated body 24 to each other. Positive electrode binding section 25A is integrally disposed in positive electrode lead frame 25. Positive electrode binding section 25A is folded so as to cover positive electrode section 22 of each element 21 along the outer periphery of positive electrode section 22. Then, positive electrode binding section 25A and positive electrode sections 22 are integrally joined to each other by laser welding or the like at welding sections 25B. Similarly, negative electrode lead frame 26 integrally joins negative electrode sections 23 of laminated body 24 to each other. Negative electrode lead frame 26 and negative electrode sections 23 are joined to each other by a conductive adhesive (not shown).

Positive electrode lead frame 25 is jointed to the upper surface of positive electrode common terminal 27. Thin sections 27B are disposed at both ends of the width direction of positive electrode common terminal 27, respectively. The central part other than thin sections 27B serves as positive electrode terminal section 27A during mounting.

Negative electrode lead frame 26 is jointed to the upper surface of negative electrode common terminal 28. Negative electrode common terminal 28 also has thin section 28B in its central part of the width direction. Both ends other than thin section 28B serve as negative electrode terminal sections 28A during mounting.

Insulating covering resin 29 integrally covers laminated body 24, positive electrode lead frames 25, negative electrode lead frame 26, positive electrode common terminals 27, and negative electrode common terminal 28. Thin sections 27B and thin section 28B respectively disposed in positive electrode common terminals 27 and negative electrode common terminal 28 are also integrally covered with insulating covering resin 29. Positive electrode terminal sections 27A are exposed at two facing positions and negative electrode terminal sections 28A are exposed at two facing places on the lower surface as the mounting surface of the chip-type solid electrolytic capacitor. Thus, a four-terminal structure is formed.

In this conventional chip-type solid electrolytic capacitor, the above-mentioned four-terminal structure allows magnetic fluxes generated by the current flowing between respective terminals to cancel each other out. Therefore, the ESL can be significantly reduced. The ESL can be further reduced by minimizing the distances between the terminals to shorten the loop length of the current. Such a chip-type solid electrolytic capacitor is disclosed in Patent Literature 1, for example.

In the conventional chip-type solid electrolytic capacitor, negative electrode terminal sections 28A apparently take a two-terminal structure, but are actually one negative electrode terminal. Therefore, the equivalent circuit of the chip-type solid electrolytic capacitor becomes a circuit shown in FIG. 13A.

In this chip-type solid electrolytic capacitor, the direct-current component of applied current flows through the positive electrode side, and the high-frequency noise component included in the applied current flows through the negative electrode side and drops to the ground. The chip-type solid electrolytic capacitor is connected and used in this manner. However, two negative electrodes are interconnected as shown in FIG. 13B, so that the whole high-frequency noise component does not drop to the ground. As shown by arrows in FIG. 13B, the high-frequency noise component flows also to the other negative electrode terminal section side. Therefore, the high-frequency noise component is insufficiently removed and the impedance characteristic in the high-frequency region is not sufficient.

Patent Literature 1: Unexamined Japanese Patent Publication No. 2007-5760

SUMMARY OF THE INVENTION

The present invention provides a chip-type solid electrolytic capacitor excellent in impedance characteristic in a high-frequency region, and a chip-type filter having the chip-type solid electrolytic capacitor as a basic structure.

The chip-type solid electrolytic capacitor of the present invention has a laminated body of solid electrolytic capacitor elements, a pair of positive electrode common terminals, a first negative electrode common terminal, a second negative electrode common terminal, and a covering resin. The laminated body has a first group, a second group, and an insulating layer. The first group is formed of at least one flat solid electrolytic capacitor element that has a positive electrode section and a negative electrode section. The second group is formed of at least one flat solid electrolytic capacitor element that has a positive electrode section and a negative electrode section. The insulating layer electrically insulates the negative electrode section of the solid electrolytic capacitor element of the first group from the negative electrode section of the solid electrolytic capacitor element of the second group. The negative electrode section of the solid electrolytic capacitor element of the first group and the negative electrode section of the solid electrolytic capacitor element of the second group are stacked via the insulating layer. The positive electrode section of the solid electrolytic capacitor element of the first group is disposed on the opposite side to the positive electrode section of the solid electrolytic capacitor element of the second group with respect to the negative electrode sections. The pair of positive electrode common terminals are electrically connected to the positive electrode section of the solid electrolytic capacitor element of the first group and the positive electrode section of the solid electrolytic capacitor element of the second group, respectively. The first negative electrode common terminal is electrically connected to the negative electrode section of the solid electrolytic capacitor element of the first group. The second negative electrode common terminal is electrically connected to the negative electrode section of the solid electrolytic capacitor element of the second group, and is electrically insulated from the first negative electrode common terminal. The insulating covering resin covers the laminated body in a state where a part of the positive electrode common terminals and parts of the first and second negative electrode common terminals are exposed.

The chip-type filter of the present invention has the chip-type solid electrolytic capacitor as the basic structure, and has an inductance section electrically insulated from the negative electrode sections of the solid electrolytic capacitor elements of the first and second groups and interconnecting the pair of positive electrode common terminals.

In the chip-type solid electrolytic capacitor and the chip-type filter having above-mentioned structures of the present invention, the negative electrodes of the solid electrolytic capacitor elements of the first and second groups are individually led out, so that two independent negative electrodes can be formed. Thus, the high-frequency noise component included in the applied current flows through two independent negative electrode sides and drops to the ground.

DETAILED DESCRIPTION OF THE INVENTION

Exemplary embodiments of the present invention are described hereinafter with reference to the accompanying drawings. In each exemplary embodiment, elements similar to those in its preceding exemplary embodiment are denoted with the same reference marks, and the detailed descriptions of those elements are omitted.

(First Exemplary Embodiment)

Figure 1A:
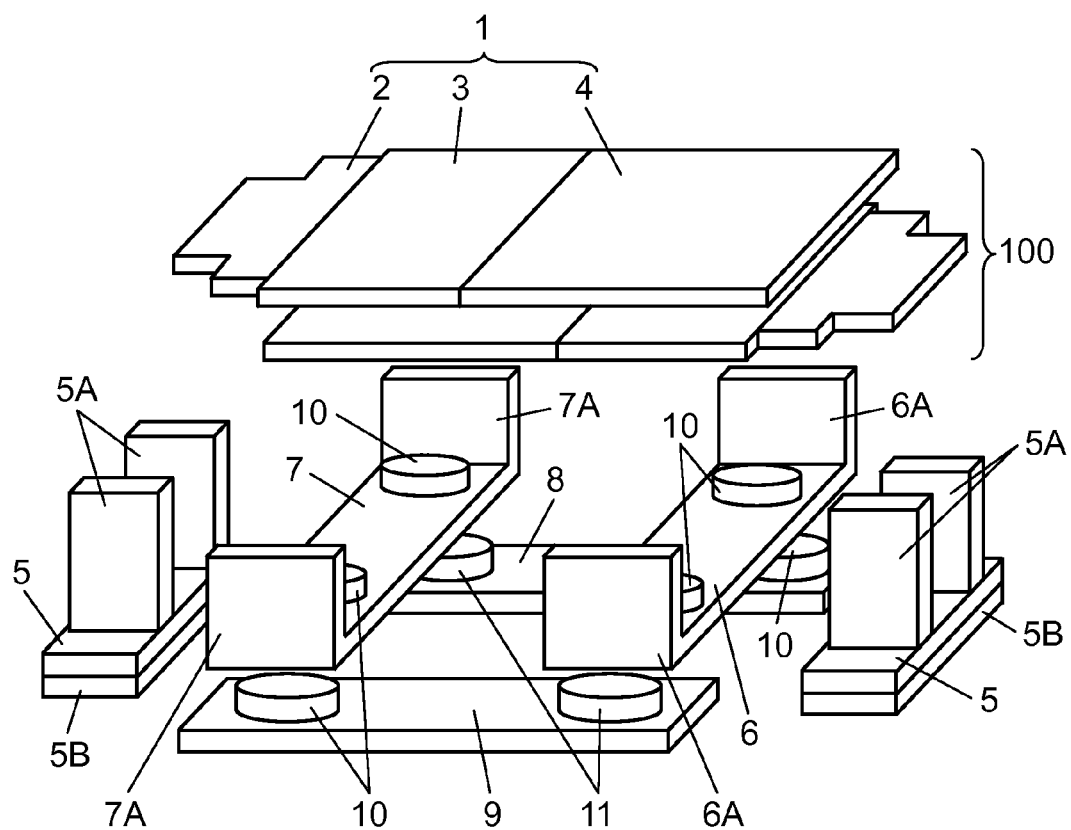
FIG. 1A is an exploded perspective view showing a basic structure of a chip-type solid electrolytic capacitor in accordance with a first exemplary embodiment of the present invention.
Figure 1B:
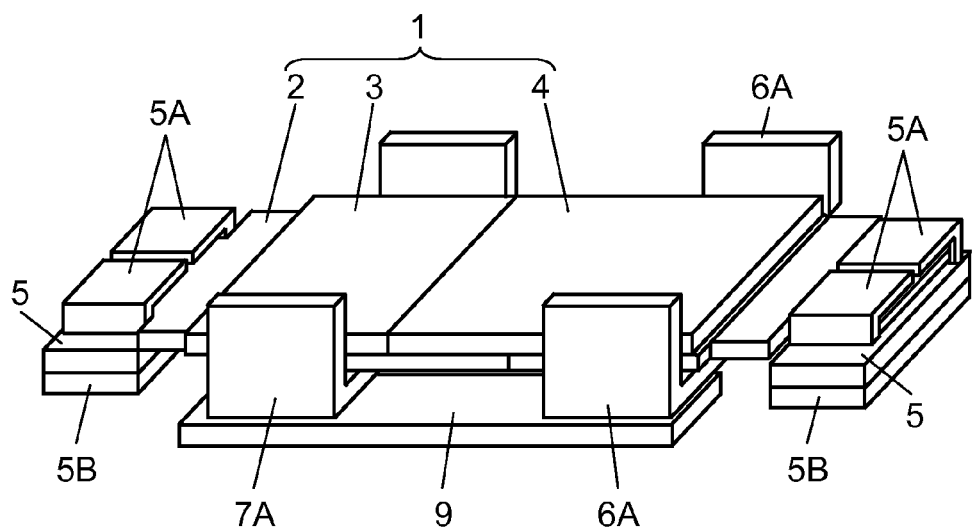
FIG. 1B is a perspective view showing a laminated state in the chip-type solid electrolytic capacitor shown in FIG. 1A.

FIG. 1A and FIG. 1B are an exploded perspective view showing a basic structure and a perspective view showing a laminated state of a chip-type solid electrolytic capacitor in accordance with a first exemplary embodiment of the present invention. This chip-type solid electrolytic capacitor has laminated body 100, positive electrode lead frames 5, first negative lead frame 6, second negative electrode lead frame 7, a pair of positive electrode common terminals 5B, first negative electrode common terminal 8, and second negative electrode common terminal 9. Laminated body 100 is formed of a plurality of flat solid electrolytic capacitor elements (hereinafter referred to as "elements") 1.

Each flat capacitor element (element) 1 is produced using a positive electrode body made of valve action metal. In the present exemplary embodiment, as an example, an aluminum foil is used as the positive electrode body. First, the surface of the positive electrode body is roughened and a dielectric oxide film layer is formed thereon. Next, an insulated section (not shown) is disposed at a predetermined position of the positive electrode body to divide the positive electrode body into positive electrode section 2 and a negative electrode forming section (not shown). A solid electrolyte layer (not shown) made of a conductive polymer is stacked on the dielectric oxide film layer (not shown) of the negative electrode forming section, and a negative electrode layer (not shown) is stacked on the solid electrolyte layer. The negative electrode layer is formed of a carbon layer (not shown) disposed on the solid electrolyte layer and a silver paste layer (not shown) disposed on the carbon layer. Thus, negative electrode section 3 is formed. Insulating layer 4 made of electrically insulating resin is formed on a part exceeding 50% of the surface of negative electrode section 3 on the opposite side to positive electrode section 2. Element 1 is produced in the procedure mentioned above.

Elements 1 are stacked so that positive electrode sections 2 are arranged alternately in the opposite sides while the stacked part of negative electrode sections 3 is centered, thereby forming laminated body 100. FIG. 1A and FIG. 1B show two elements 1 in order to make the structure easy-to-understand. Insulating layers 4 prevent electric contact between negative electrode sections 3 of two elements 1 in laminated body 100.

Each positive electrode lead frame 5 has positive electrode binding sections 5A formed integrally therewith. Positive electrode binding sections 5A are disposed on the upper surface of positive electrode lead frame 5. Positive electrode common terminal 5B is joined to the bottom surface of positive electrode lead frame 5. Positive electrode lead frames 5 are disposed on the lower surfaces of respective positive electrode sections 2 positioned at both ends of laminated body 100. Positive electrode binding sections 5A are folded along the outer periphery of positive electrode sections 2 of elements 1 so as to cover and bundle positive electrode section 2. Then, positive electrode lead frames 5 and positive electrode sections 2 are integrally joined to each other by resistance welding or laser welding. Each positive electrode common terminal 5B is not limited to an independent member, but may be formed integrally with each positive electrode lead frame 5.

First negative electrode lead frame 6 is formed in a U-shape. In other words, a pair of side wall sections 6A are disposed at both ends of first negative electrode lead frame 6. First negative electrode lead frame 6 is disposed on the lower surface of laminated body 100 so as to contact with negative electrode section 3 of the lowermost element 1. First negative electrode lead frame 6 is electrically connected to negative electrode sections 3 of odd-numbered elements 1 in the stacking direction of laminated body 100 via conductive adhesive 10. In other words, conductive adhesive 10 is applied also to the inside of side wall sections 6A, although not shown.

Second negative electrode lead frame 7 is formed in a U shape, similarly to first negative electrode lead frame 6. In other words, a pair of side wall sections 7A are disposed at both ends of second negative electrode lead frame 7. Second negative electrode lead frame 7 is disposed on the lower surface of laminated body 100 so as to contact with insulating layer 4 of the lowermost element 1. Second negative electrode lead frame 7 is electrically connected to negative electrode sections 3 of even-numbered elements 1 in the stacking direction of laminated body 100 via conductive adhesive 10. In other words, conductive adhesive 10 is applied also to the inside of side wall sections 7A, although not shown.

First negative electrode common terminal 8 and second negative electrode common terminal 9 are formed similarly. First negative electrode lead frame 6 is electrically connected to one end of the upper surface of first negative electrode common terminal 8 via conductive adhesive 10. First negative electrode lead frame 6 is bound to one end of the upper surface of second negative electrode common terminal 9 in the insulated state via insulating adhesive 11. While, second negative electrode lead frame 7 is bound to another end of the upper surface of first negative electrode common terminal 8 in the insulated state via insulating adhesive 11. Second negative electrode lead frame 7 is electrically connected to another end of the upper surface of second negative electrode common terminal 9 via conductive adhesive 10.

Thus, negative electrode sections 3 of odd-numbered elements 1 in the stacking direction of laminated body 100 are electrically connected to first negative electrode common terminal 8. Negative electrode sections 3 of even-numbered elements 1 in the stacking direction of laminated body 100 are electrically connected to second negative electrode common terminal 9. A chip-type solid electrolytic capacitor is thus formed in a four-terminal structure where the pair of positive electrode common terminals 5B are independent and first negative electrode common terminal 8 and second negative electrode common terminal 9 are independent.

Positive electrode common terminals 5B are disposed along the mutually opposite sides on the bottom surface (mounting surface) of the solid electrolytic capacitor, and first negative electrode common terminal 8 is disposed at one end of the direction crossing the linking direction between positive electrode common terminals 5B. Second negative electrode common terminal 9 is disposed at another end on the opposite side to first negative electrode common terminal 8.

The covering resin such as epoxy covers all members including laminated body 100 so that the bottom surfaces of positive electrode common terminals 5B and respective bottom surfaces of first negative electrode common terminal 8 and second negative electrode common terminal 9 are exposed, although not shown.

In the chip-type solid electrolytic capacitor of the present embodiment, insulating layer 4 is formed on a part exceeding 50% of the surface of negative electrode section 3 of each element 1. Insulating layer 4 is formed by applying thermosetting resin such as epoxy to a predetermined position on negative electrode section 3 and heating and hardening it. Alternatively, ultraviolet curing resin may be used. Besides, insulating layer 4 is formed by dissolving resin material in a solvent, applying it to the predetermined position of negative electrode section 3, and removing the solvent. Fillers of alumina and silica may be mixed. Negative electrode section 3 of element 1 has an exposed section (negative electrode section 3 in FIG. 1A) electrically connected to first negative electrode common terminal 8 or second negative electrode common terminal 9. Elements 1 having such a structure are stacked so that positive electrode sections 2 are arranged alternately on the opposite sides, thereby forming laminated body 100. Thanks to this structure, negative electrode sections 3 of laminated body 100 are separated from each other by insulating layers 4, and become independent of each other.

Figure 2A:
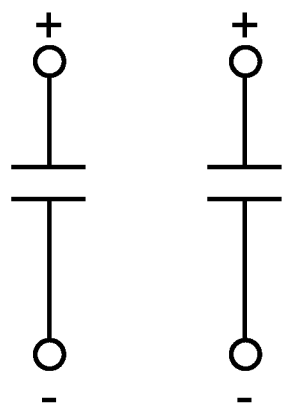
FIG. 2A is an equivalent circuit diagram of the chip-type solid electrolytic capacitor shown in FIG. 1A.
Figure 2B:
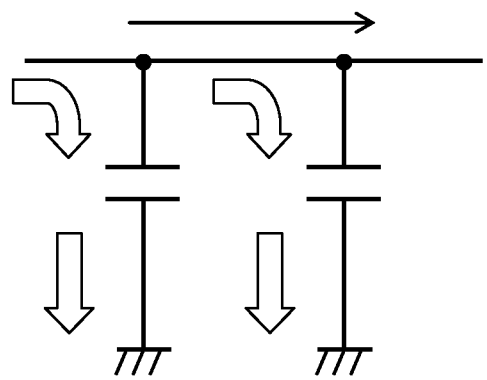
FIG. 2B is an equivalent circuit diagram when the chip-type solid electrolytic capacitor shown in FIG. 1A is used as a high-frequency filter.

FIG. 2A is an equivalent circuit diagram of the chip-type solid electrolytic capacitor of the present embodiment. FIG. 2B is an equivalent circuit diagram when this chip-type solid electrolytic capacitor is used as a high-frequency filter. Since the chip-type solid electrolytic capacitor has the above-mentioned structure, negative electrode sections 3 of odd-numbered elements 1 in the stacking direction of laminated body 100 and negative electrode sections 3 of even-numbered elements 1 are independent of each other, as shown in FIG. 2A and FIG. 2B.

Therefore, the high-frequency noise component included in the current applied to the chip-type solid electrolytic capacitor flows through two independent negative electrode common terminals 8 and 9 and is efficiently dropped to the ground. As a result, the high-frequency noise component is sufficiently removed. In other words, the impedance characteristic in the high-frequency region of the chip-type solid electrolytic capacitor is improved.

(Second Exemplary Embodiment)

Figure 3A:
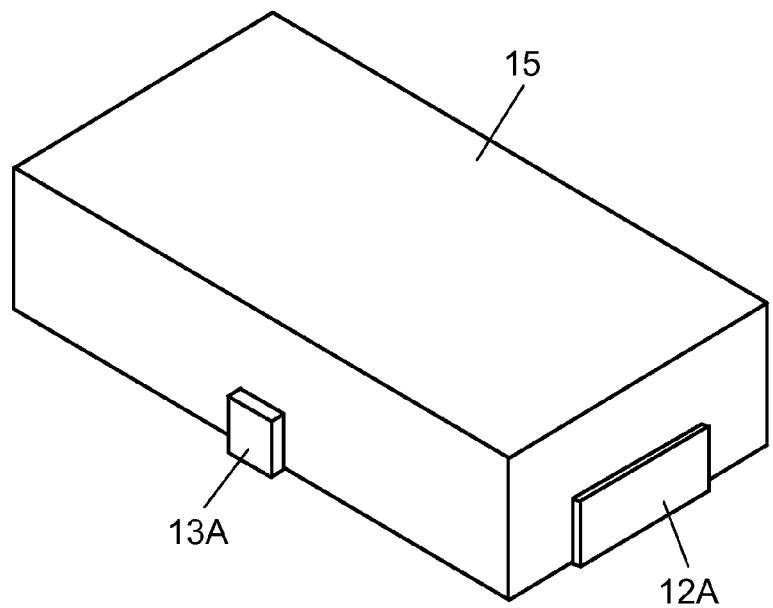
FIG. 3A is a perspective view from the upper surface side showing a structure of a chip-type solid electrolytic capacitor in accordance with a second exemplary embodiment of the present invention.
Figure 3B:
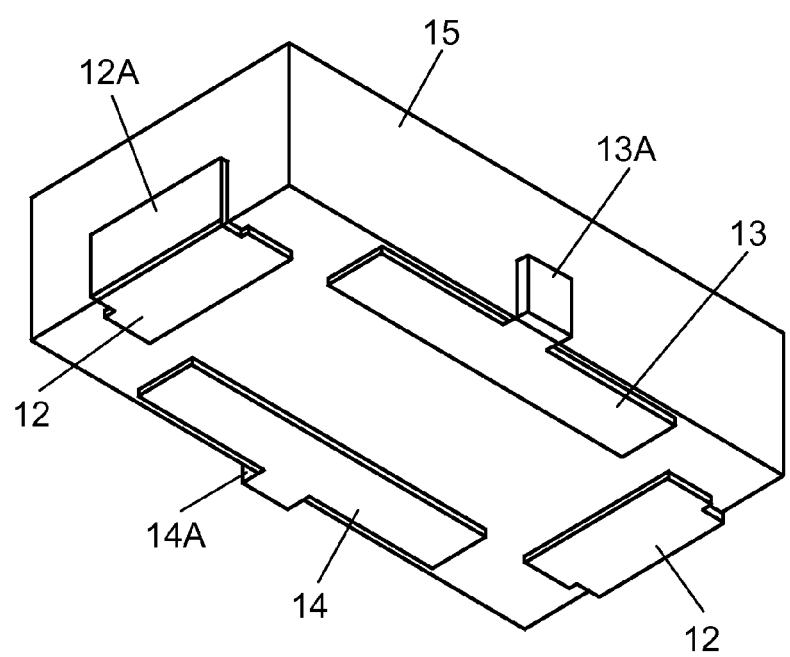
FIG. 3B is a perspective view from the bottom surface side of the chip-type solid electrolytic capacitor shown in FIG. 3A.
Figure 4A:
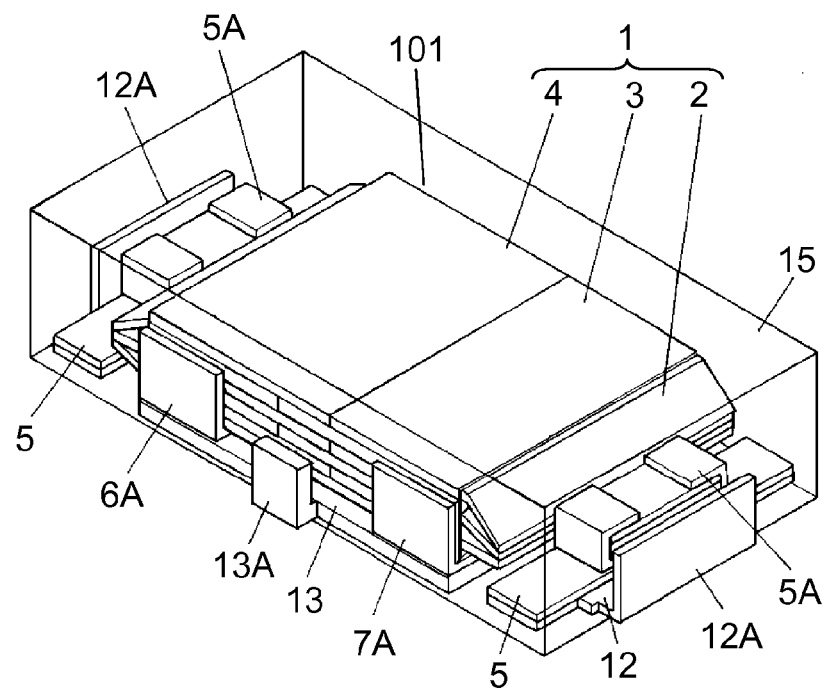
FIG. 4A is a see-through perspective view from the upper surface side showing the internal structure of the chip-type solid electrolytic capacitor shown in FIG. 3A.
Figure 4B:
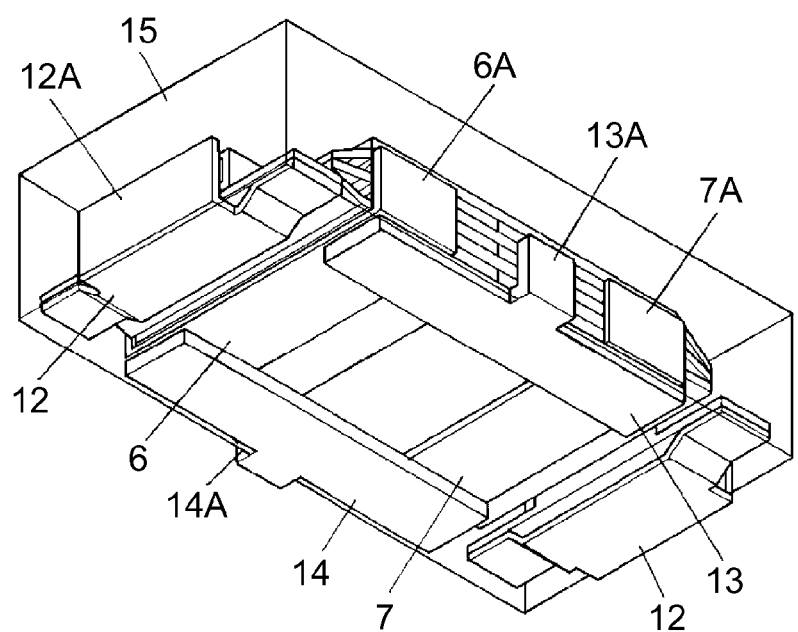
FIG. 4B is a perspective view from the bottom surface side of the chip-type solid electrolytic capacitor shown in FIG. 3A.
Figure 5A:
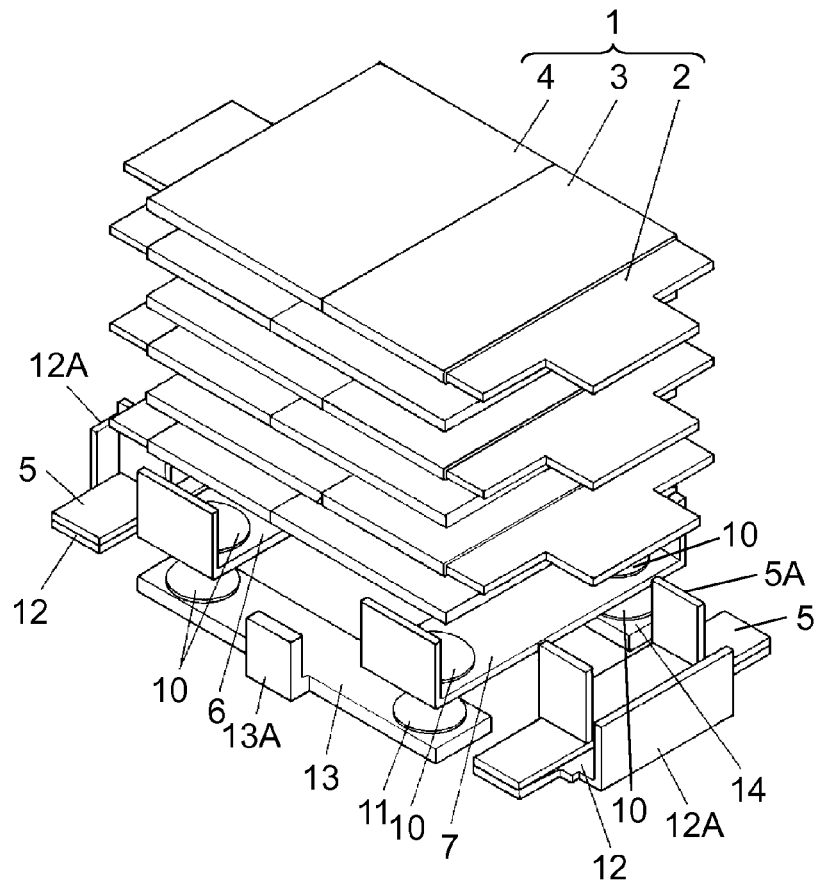
FIG. 5A is an exploded perspective view before resin molding of the chip-type solid electrolytic capacitor shown in FIG. 3A.
Figure 5B:
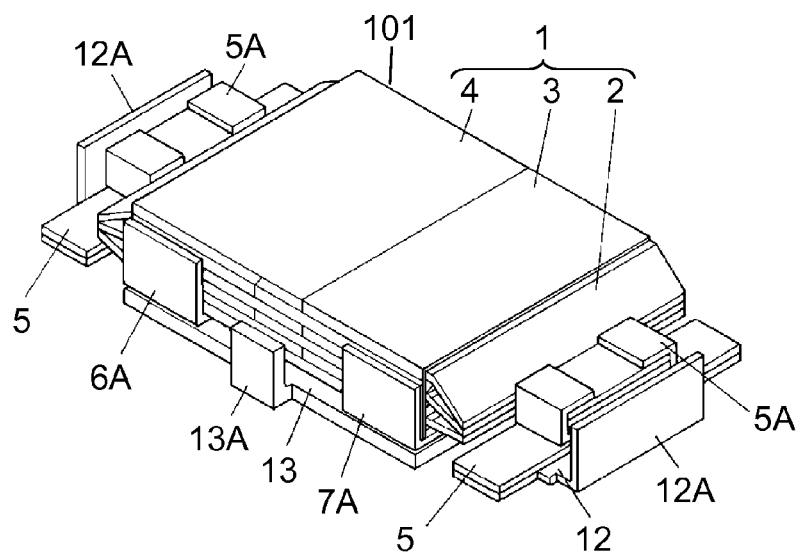
FIG. 5B is a perspective view before resin molding of the chip-type solid electrolytic capacitor shown in FIG. 3A.

FIG. 3A and FIG. 3B are a perspective view from the upper surface side and a perspective view from the bottom surface side showing a structure of a chip-type solid electrolytic capacitor in accordance with a second exemplary embodiment of the present invention, respectively. FIG. 4A and FIG. 4B are a perspective view from the upper surface side and a perspective view from the bottom surface side showing the internal structure of the chip-type solid electrolytic capacitor, respectively. FIG. 5A and FIG. 5B are an exploded perspective view and a perspective view before resin molding of the chip-type solid electrolytic capacitor.

The present exemplary embodiment differs from the first exemplary embodiment in that the present embodiment employs laminated body 101 having more elements 1 than that described using FIG. 1A and FIG. 1B. The structure except this is similar to that of the first exemplary embodiment.

As shown in FIG. 4A through FIG. 5B, in the chip-type solid electrolytic capacitor of the present embodiment, laminated body 101 is formed by stacking six elements 1 so that positive electrode sections 2 are arranged alternately on the opposite sides. Each element 1 is formed similarly to the first exemplary embodiment.

A pair of positive electrode common terminals 12 are joined to the lower surfaces of positive electrode lead frames 5 disposed on the opposite sides of laminated body 101. Folded section 12A is formed by raising one end of each positive electrode common terminal 12. Folded section 12A appears from covering resin 15 (described later) after laminated body 101 is molded with covering resin 15. Thus, a soldering fillet is easily formed by soldering work during mounting the capacitor to a circuit board.

Negative electrode sections 3 of odd-numbered elements 1 in the stacking direction of laminated body 101 are electrically connected to first negative electrode lead frame 6 (including side wall sections 6A) via conductive adhesive 10. Negative electrode sections 3 of even-numbered elements 1 in the stacking direction of laminated body 101 are connected to second negative electrode lead frame 7 (including side wall sections 7A) via conductive adhesive 10.

First negative electrode lead frame 6 is electrically connected to one end of the upper surface of first negative electrode common terminal 13 via conductive adhesive 10, and is bound to one end of the upper surface of second negative electrode common terminal 14 in the insulated state via insulating adhesive 11. Second negative electrode lead frame 7 is bound to another end of the upper surface of first negative electrode common terminal 13 in the insulated state via insulating adhesive 11, and is electrically connected to another end of the upper surface of second negative electrode common terminal 14 via conductive adhesive 10.

First negative electrode common terminal 13 has folded section 13A formed by raising one end of it, and second negative electrode common terminal 14 has folded section 14A formed by raising one end of it. The structures and effects of folded sections 13A and 14A are similar to those of folded section 12A.

Thanks to this structure, negative electrode sections 3 of odd-numbered (first, third, and fifth) elements 1 in the stacking direction of laminated body 101 are electrically connected to first negative electrode common terminal 13. Negative electrode sections 3 of even-numbered (second, fourth, and sixth) elements 1 in the stacking direction of laminated body 101 are electrically connected to second negative electrode common terminal 14. Similarly to the first embodiment, the chip-type solid electrolytic capacitor has a four-terminal structure where the pair of positive electrode common terminals 12 are independent and first negative electrode common terminal 13 and second negative electrode common terminal 14 are independent.

Insulating covering resin 15 is made of epoxy resin or the like. Covering resin 15 integrally covers the laminated body, positive electrode lead frames 5, first negative electrode lead frame 6, and second negative electrode lead frame 7. At this time, the bottom surfaces of the pair of positive electrode common terminals 12 and folded sections 12A, the bottom surface of first negative electrode common terminal 13 and folded section 13A, and the bottom surface of second negative electrode common terminal 14 and folded section 14A are exposed from the outer surfaces of covering resin 15. The chip-type solid electrolytic capacitor of the present embodiment is formed in this structure. The chip-type solid electrolytic capacitor is mounted to a circuit board (not shown) via positive electrode common terminals 12, first negative electrode common terminal 13, and second negative electrode common terminal 14 exposed from the bottom surface of covering resin 15.

The chip-type solid electrolytic capacitor of the present embodiment having this structure includes two different independent negative electrodes, similarly to the chip-type solid electrolytic capacitor of the first embodiment. Thanks to this structure, the high-frequency noise component included in the current applied to the chip-type solid electrolytic capacitor flows through two independent negative electrodes and is efficiently dropped to the ground. As a result, the high-frequency noise component is sufficiently removed. In other words, the impedance characteristic in the high-frequency region of the chip-type solid electrolytic capacitor can be improved.

Laminated body 101 is formed by arranging positive electrode sections 2 alternately on the opposite sides, the pair of positive electrode common terminals 12 are exposed at two opposite positions, and first negative electrode common terminal 13 and second negative electrode common terminal 14 are exposed at two opposite positions on the mounting surface, thereby forming a four-terminal structure. Therefore, magnetic fluxes generated by the current flowing between respective terminals cancel each other out and hence the equivalent series inductance component is significantly reduced. As a result, the ESR is reduced, the ESL is reduced, and the impedance can be reduced.

The excellent characteristic of the chip-type solid electrolytic capacitor of the present exemplary embodiment is described using a specific example.

First, six elements 1 having a size of 3.0 mm×4.0 mm×0.18 mm and a rated value of 2 V and 38 μF are prepared. As shown in FIG. 5A, elements 1 are stacked so that electrode sections 2 are arranged alternately on the opposite sides. A chip-type solid electrolytic capacitor is produced using laminated body 101 having such a structure. Insulating layer 4 is formed by coating negative electrode section 3 with resin paste where 200 parts of weight of alumina filler having an average particle size of 3 μm is added to 100 parts of weight of epoxy resin, and thermosetting it. This resin paste is applied to the region of 55% of negative electrode section 3 from the end of the opposite side of positive electrode section 2.

Figure 6:
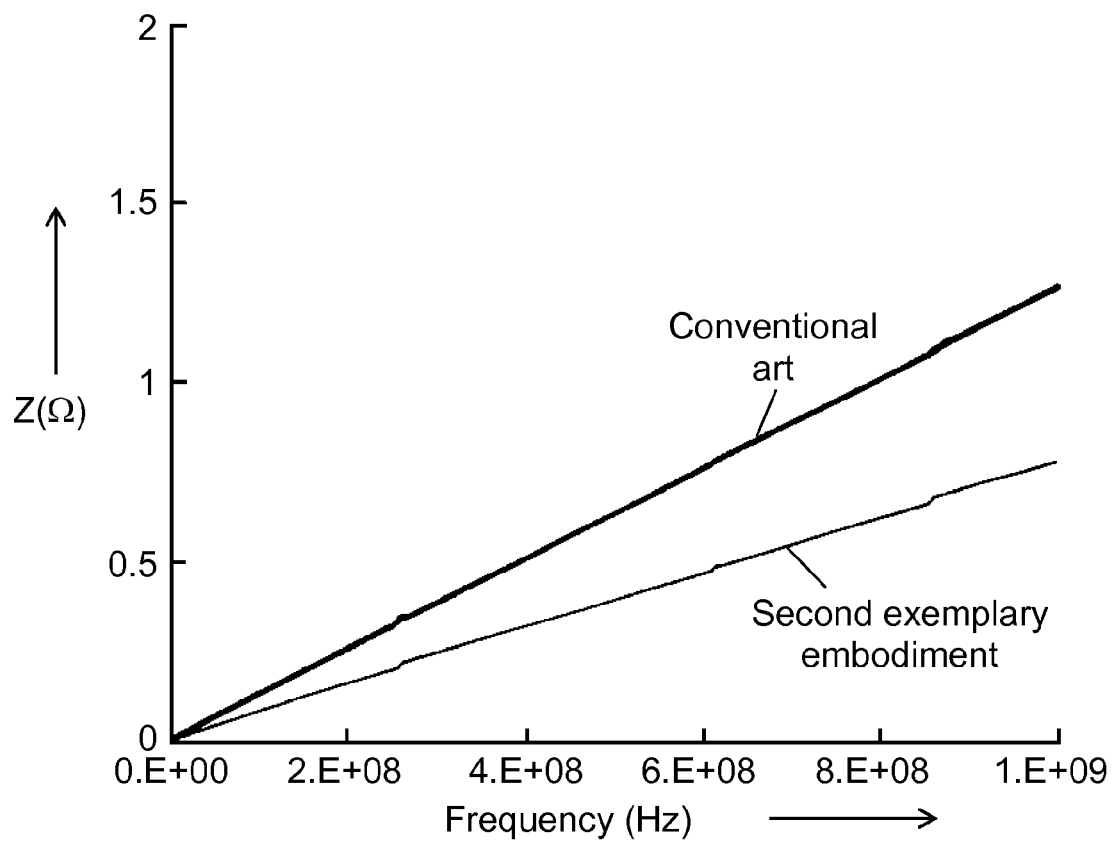
FIG. 6 is an impedance characteristic diagram of the chip-type solid electrolytic capacitor shown in FIG. 3A.

FIG. 6 and Table 1 show the measuring result of the impedance characteristic in the high-frequency region of the chip-type solid electrolytic capacitor having such a structure of the present embodiment. FIG. 6 and Table 1 also show the measuring result of the conventional art that is produced similarly to the capacitor of the present embodiment except that insulating layer 4 is not formed. Table 1 shows the result obtained by producing and measuring three chip-type solid electrolytic capacitors.

TABLE 1

|  | Average value (Ω) of impedance (Z) | Variation (Ω) of impedance (Z) |
| --- | --- | --- |
| Second exemplary embodiment | 0.75 | 0.06 |
| Conventional art | 1.25 | 0.10 |

As is clear from FIG. 6 and Table 1, the impedance (Z) at 1 GHz of the chip-type solid electrolytic capacitor of the present embodiment can be reduced to about 60% of the conventional capacitor. The variation (difference between maximum value and minimum value) of the impedance of the capacitor of the present embodiment is also smaller. Therefore, the chip-type solid electrolytic capacitor of the present embodiment can sufficiently respond to a strong demand for improvement of the high-frequency characteristic.

(Third Exemplary Embodiment)

Figure 7A:
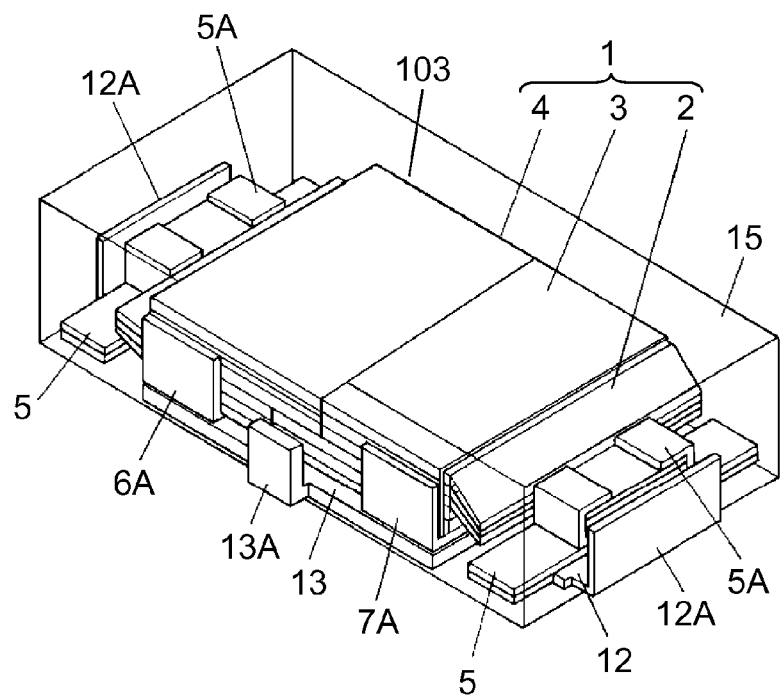
FIG. 7A is a perspective view from the upper surface side showing a structure of a chip-type solid electrolytic capacitor in accordance with a third exemplary embodiment of the present invention.
Figure 7B:
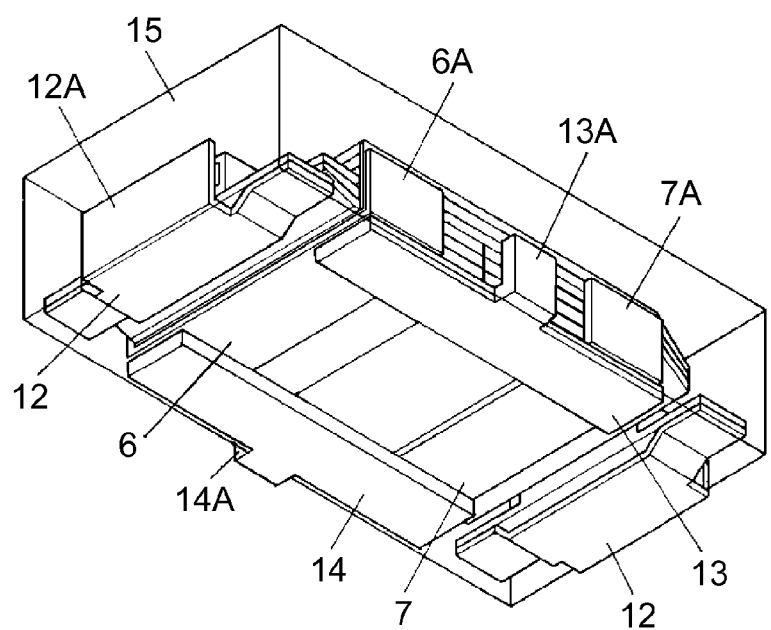
FIG. 7B is a perspective view from the bottom surface side of the chip-type solid electrolytic capacitor shown in FIG. 7A.
Figure 8A:
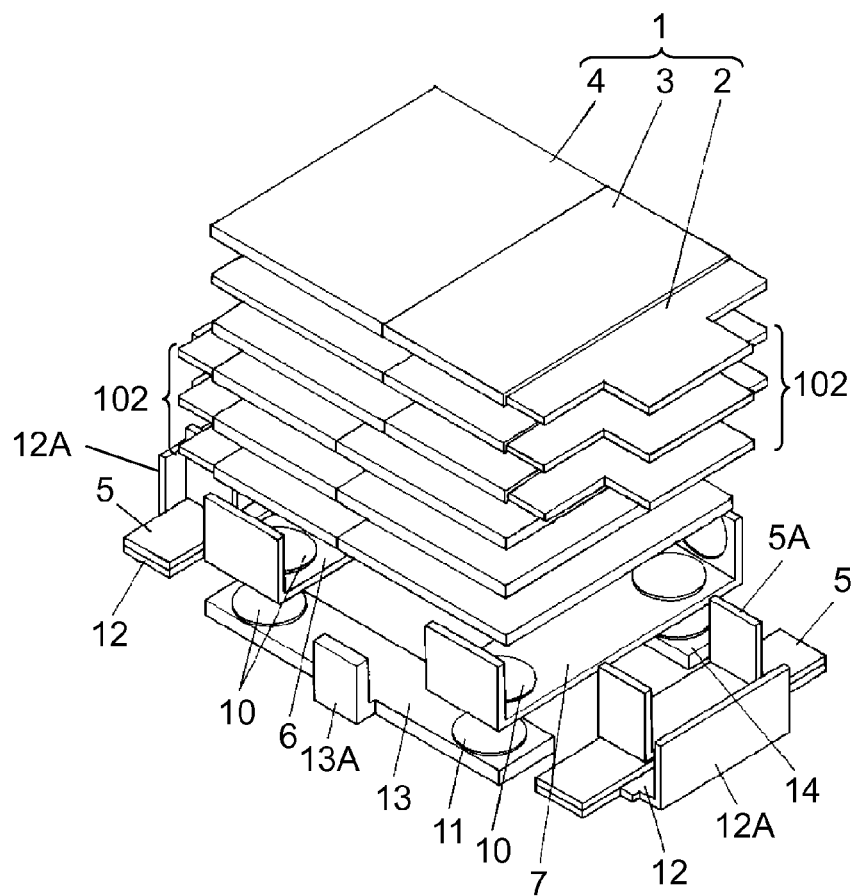
FIG. 8A is an exploded perspective view before resin molding of the chip-type solid electrolytic capacitor shown in FIG. 7A.
Figure 8B:
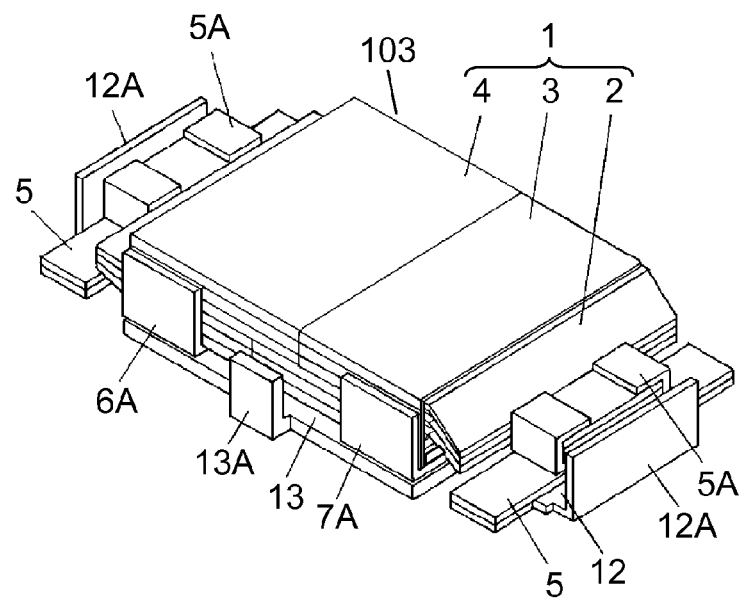
FIG. 8B is a perspective view before resin molding of the chip-type solid electrolytic capacitor shown in FIG. 7A.

FIG. 7A and FIG. 7B are a perspective view from the upper surface side and a perspective view from the bottom surface side showing a structure of a chip-type solid electrolytic capacitor in accordance with a third exemplary embodiment of the present invention, respectively. FIG. 8A and FIG. 8B are an exploded perspective view and a perspective view before resin molding of the chip-type solid electrolytic capacitor. The laminated body structure of the chip-type solid electrolytic capacitor of the present exemplary embodiment partially differs from that of the chip-type solid electrolytic capacitor of the second embodiment described using FIG. 3A through FIG. 5B. The structure except this is similar to that of the second exemplary embodiment.

In the present exemplary embodiment, element unit 102 is formed by stacking three elements 1 in the same direction. In other words, elements 1 are stacked so that respective positive electrode sections 2 are on the same side with respect to negative electrode sections 3 in element unit 102. Laminated body 103 is formed by stacking element units 102 so that positive electrode sections 2 are arranged on the opposite sides.

Two element units 102 are stacked in FIG. 7A through FIG. 8B, but three or more element units may be stacked. In the latter case, negative electrode sections 3 of odd-numbered element units 102 in the stacking direction of laminated body 103 are connected to first negative electrode lead frame 6 via conductive adhesive 10. Negative electrode sections 3 of even-numbered element units 102 in the stacking direction of laminated body 103 are connected to second negative electrode lead frame 7 via conductive adhesive 10.

The chip-type solid electrolytic capacitor having this structure of the present exemplary embodiment has an effect similar to that of the chip-type solid electrolytic capacitors of first and second exemplary embodiments. In each element unit 102, a plurality of negative electrode sections 3 are stacked. Negative electrode sections 3 of each element unit 102 are connected to first negative electrode lead frame 6 or second negative electrode lead frame 7. Therefore, the contact between negative electrode sections 3 and first negative electrode lead frame 6 and the contact between negative electrode sections 3 and second negative electrode lead frame 7 are improved, and the ESR is reduced.

Additionally, the folded size of positive electrode sections 2 of element units 102 can be reduced by one-half. Therefore, when positive electrode binding sections 5A are folded so as to cover and bundle positive electrode sections 2 of respective elements 1 along the outer periphery of positive electrode sections 2, damage applied to elements 1 can be reduced. As a result, degradation in leakage current characteristic can be suppressed.

In the first and second embodiments, elements 1 are stacked so that positive electrode sections 2 are arranged alternately in the opposite sides. In the third embodiment, each element unit 102 is formed by stacking elements 1 so that respective positive electrode sections 2 are on the same side with respect to negative electrode sections 3, and plurality of element units 102 are stacked so that positive electrode sections 2 are arranged alternately on the opposite sides. Besides this structure, a first group may be formed of elements 1 having positive electrode sections 2 on one side, and a second group may be formed of elements 1 having positive electrode sections 2 on the opposite side to positive electrode sections 2 of the first group. In other words, positive electrode sections 2 of capacitor elements 1 of the first group are disposed on the opposite side to positive electrode sections 2 of capacitor elements 1 of the second group with respect to the stacked section of negative electrode sections 3. FIG. 4A and FIG. 8A show the case that the number of elements 1 is six, as an example. However, the number of elements 1 is not limited. Each of the first group and second group may be formed of one or more capacitor elements 1.

As described in the second embodiment, however, it is preferable that each element 1 of the first group and each element 1 of the second group are stacked alternately. Therefore, magnetic fluxes generated by the current flowing between respective terminals cancel each other out and hence the equivalent series inductance component is significantly reduced, and the impedance can be reduced.

On the other hand, as described in the third embodiment, it is preferable that element unit 102 (first element unit) is formed by directly stacking elements 1 of the first group and another element unit 102 (second element unit) is formed by directly stacking elements 1 of the second group. By forming each element unit 102 by stacking plurality of elements 1 in that manner, the workability and the assembling accuracy are improved.

As in the first through third embodiments, it is preferable that the number of elements 1 of the first group is equal to the number of elements 1 of the second group. By setting the number of elements to be even, magnetic fluxes generated by the current flowing through respective elements 1 cancel each other out. When element units 102 are stacked as in the third embodiment, it is preferable that the number of first element units is equal to that of second element units. This also allows magnetic fluxes generated by the current flowing through respective elements 1 to cancel each other out.

In the first through third embodiments, insulating layer 4 is formed on a part exceeding 50% of the surface of negative electrode section 3 of each element 1 on the opposite side to positive electrode section 2. However, it is acceptable that insulating layer 4 insulates negative electrode section 3 of each element 1 of the first group from negative electrode section 3 of each element 1 of the second group. Therefore, an insulating sheet may be disposed between negative electrode section 3 of each element 1 of the first group and negative electrode section 3 of each element 1 of the second group, and may be used as insulating layer 4. However, the method of forming a resin layer on negative electrode section 3 and using it as insulating layer 4 is industrially easier than the method of accurately stacking a thin insulating sheet and element 1.

In the first through third embodiments, first negative electrode lead frame 6 is bonded to second negative electrode common terminal 9 or 14 via insulating adhesive 11, and second negative electrode lead frame 7 is bonded to first negative electrode common terminal 8 or 13 via insulating adhesive 11. However, first negative electrode common terminal 8 or 13 and second negative electrode common terminal 9 or 14 may be shortened. This manner prevents first negative electrode lead frame 6 from coming into contact with second negative electrode common terminal 9 or 14, and prevents second negative electrode lead frame 7 from coming into contact with first negative electrode common terminal 8 or 13. In other words, it is acceptable that first negative electrode common terminal 8 or 13 is electrically insulated from second negative electrode common terminal 9 or 14 in the chip-type solid electrolytic capacitor. However, the binding through insulating adhesive 11 causes first negative electrode lead frame 6 and second negative electrode lead frame 7 to be supported at both ends during assembling. Therefore, there is no need to support first negative electrode lead frame 6 and second negative electrode lead frame 7 with a fixture or the like until conductive adhesive 10 hardens.

(Fourth Exemplary Embodiment)

Figure 9:
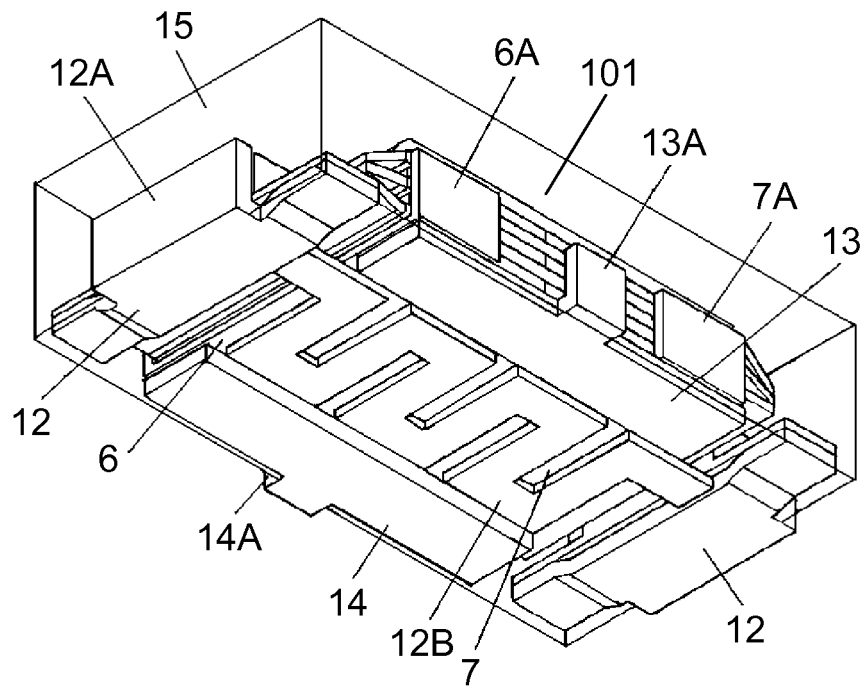
FIG. 9 is a perspective view from the bottom surface side of a chip-type filter in accordance with a fourth exemplary embodiment of the present invention.

Next, a chip-type filter including, as a basic structure, the chip-type solid electrolytic capacitor that has been described in the second exemplary embodiment is described. FIG. 9 is a perspective view from the bottom surface side of a chip-type filter in accordance with a fourth exemplary embodiment.

In the chip-type filter of the fourth exemplary embodiment, the pair of positive electrode common terminals 12 of the chip-type solid electrolytic capacitor of the second exemplary embodiment are connected through meandering inductor section 12B. Inductor section 12B is insulated from first negative electrode lead frame 6 and second negative electrode lead frame 7 by space or covering resin 15. The structure except this is similar to that of the chip-type solid electrolytic capacitor of the second exemplary embodiment.

Figure 10A:
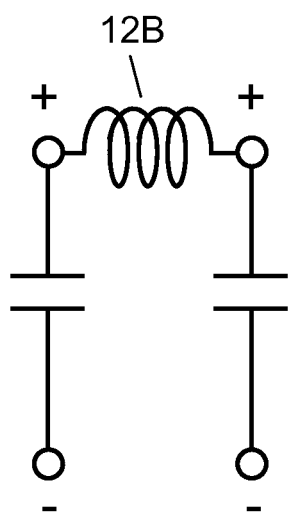
FIG. 10A is an equivalent circuit diagram of the chip-type filter shown in FIG. 9.

In the chip-type filter having this structure of the present embodiment, first negative electrode common terminal 13 is electrically insulated from second negative electrode common terminal 14 in the chip-type solid electrolytic capacitor. In other words, negative electrode sections 3 of elements 1 of the first group are independently insulated from negative electrode sections 3 of elements 1 of the second group. The equivalent circuit of this chip-type filter has a π-type filter as shown in FIG. 10A.

Figure 10B:
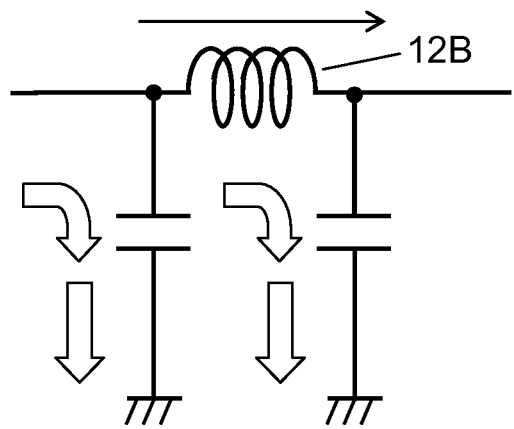
FIG. 10B is an equivalent circuit diagram when the chip-type filter shown in FIG. 9 is used as a π-type filter.

When this chip-type filter is used, as shown in the equivalent circuit diagram of FIG. 10B, negative electrode sections 3 of odd-numbered elements 1 and negative electrode sections 3 of even-numbered elements 1 in the stacking direction of laminated body 101 serve as independent negative electrodes and are connected to the ground.

Therefore, the high-frequency noise component included in the current applied to the chip-type filter flows through two independent negative electrodes and is efficiently dropped to the ground. In other words, similarly to the second exemplary embodiment, the high-frequency noise component can be sufficiently removed. Thus, a chip-type filter excellent in impedance characteristic in the high-frequency region can be produced.

The π-type filter can be formed of one component by connecting positive electrode common terminals 12 through a plate-like inductor section 12B. This method can reduce the ESL comparing with the method of connecting the chip-type solid electrolytic capacitor of the second embodiment and an inductor through an external circuit.

Next, an excellent characteristic of the chip-type filter of the present embodiment is described using a specific example. The part of the chip-type solid electrolytic capacitor has a structure similar to that used when the result of Table 1 and FIG. 6 is obtained. Inductor section 12B has a three-turn meandering shape, and the reactance is 3.8 nH.

Figure 11:
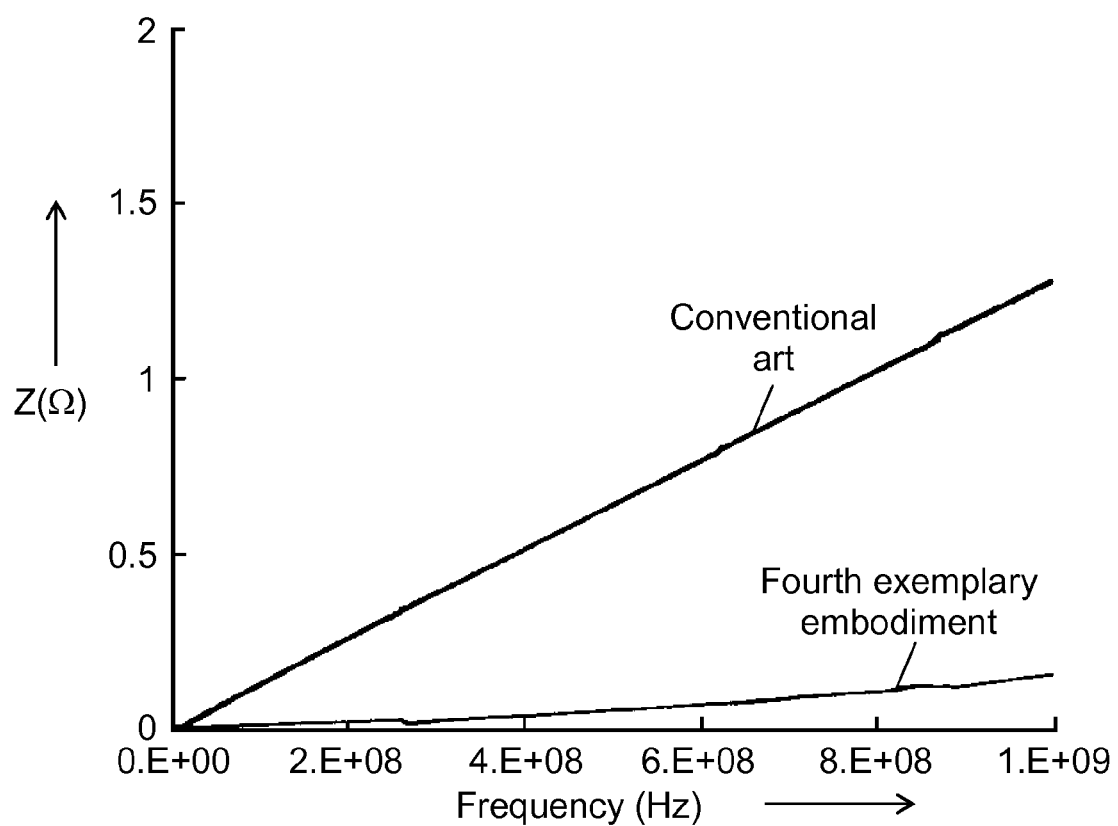
FIG. 11 is an impedance characteristic diagram of the chip-type filter shown in FIG. 9.
Figure 12A:
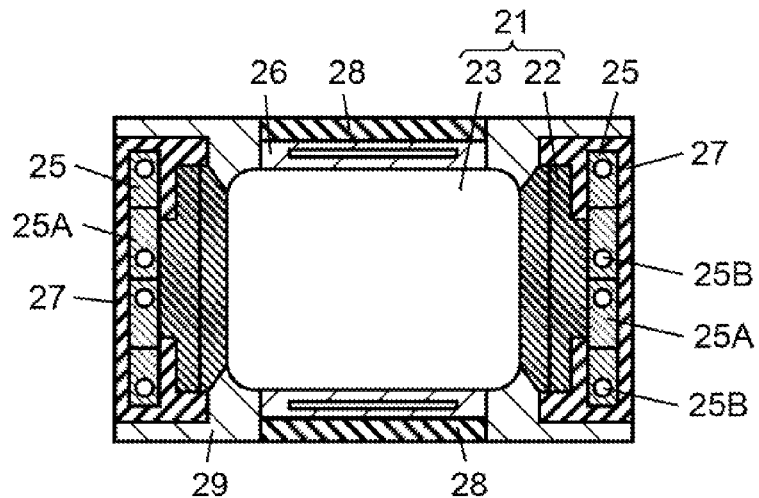
FIG. 12A is a plan sectional view showing a structure of a conventional chip-type solid electrolytic capacitor.
Figure 12B:
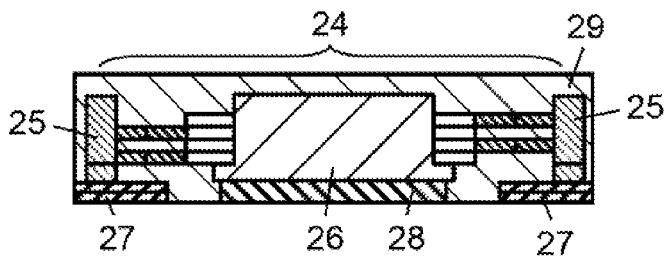
FIG. 12B is a front sectional view of the chip-type solid electrolytic capacitor shown in FIG. 12A.
Figure 12C:
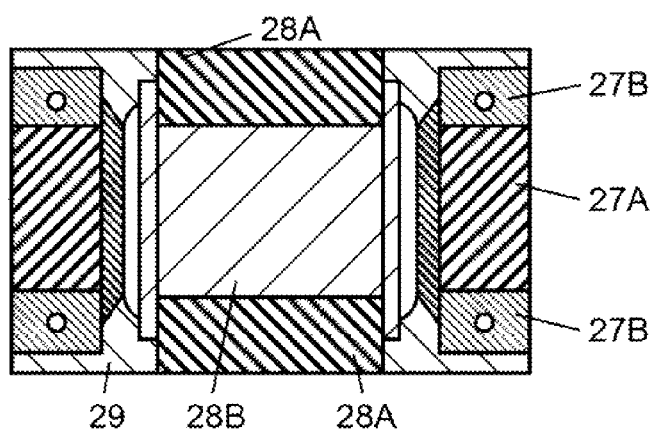
FIG. 12C is a bottom sectional view of the chip-type solid electrolytic capacitor shown in FIG. 12A.
Figure 12D:
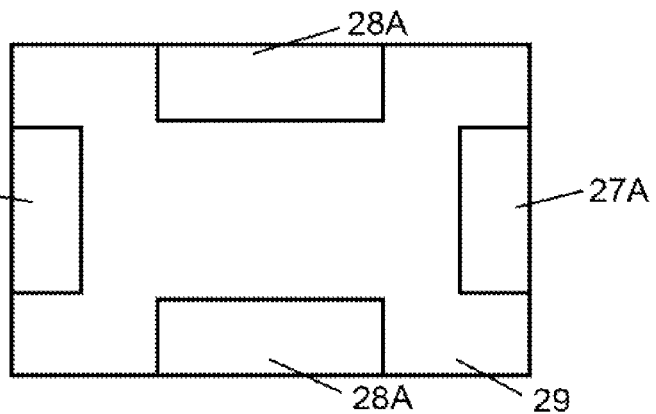
FIG. 12D is a bottom view of the chip-type solid electrolytic capacitor shown in FIG. 12A.
Figure 13A:
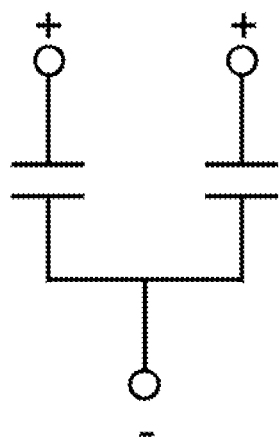
FIG. 13A is an equivalent circuit diagram of the chip-type solid electrolytic capacitor shown in FIG. 12A
Figure 13B:
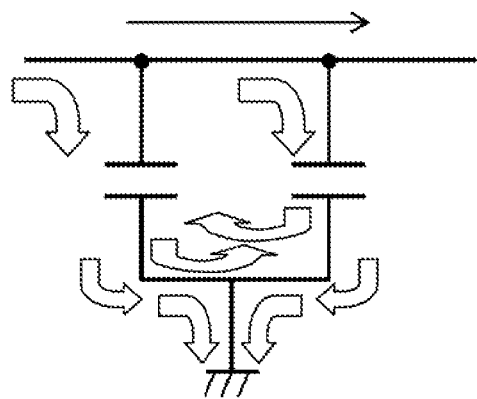
FIG. 13B is an equivalent circuit diagram when the chip-type solid electrolytic capacitor shown in FIG. 12A is used as a high-frequency filter.

FIG. 11 and Table 2 show the measuring result of the impedance characteristic in the high-frequency region of the chip-type filter that has such a structure of the present embodiment, comparing with a conventional art having no insulating layer 4. Table 2 shows the result obtained by producing and measuring three chip-type filters.

TABLE 2

|  | Average value (Ω) of impedance (Z) | Variation (Ω) of impedance (Z) |
|---|---|---|
| Fourth exemplary embodiment | 0.18 | 0.02 |
| Conventional art | 1.25 | 0.10 |

As is clear from FIG. 11 and Table 2, the impedance (Z) at 1 GHz of the chip-type filter of the present embodiment can be reduced to about 14.4% of the conventional capacitor. The variation (difference between maximum value and minimum value) in the present embodiment is also smaller. Therefore, the chip-type filter of the present embodiment can sufficiently respond to a strong demand for improvement of the high-frequency characteristic.

Inductor section 12B has the meandering shape in the present embodiment; however, the present invention is not limited to this. Inductor section 12B may have any shape such as a simple linear shape. The shape is not especially limited as long as the chip-type filter can have a reactance providing a required frequency characteristic.

The chip-type filter including, as a basic structure, the chip-type solid electrolytic capacitor of the second exemplary embodiment has been described. However, the present invention is not limited to this. The first embodiment or the third embodiment can be applied to a chip-type filter. In other words, it is acceptable that a pair of positive electrode common terminals 5B or 12 are connected through inductor section 12B.

A chip-type solid electrolytic capacitor and a chip-type filter of the present invention have an excellent impedance characteristic in the high-frequency region, especially are suitable for application to a field that places importance on the high-frequency characteristic.

The invention claimed is:

1. A chip-type filter comprising:
a laminated body including:
a first group formed of at least one first solid electrolytic capacitor element that has a first positive electrode section and a first negative electrode section;
a second group formed of at least one second solid electrolytic capacitor element that has a second positive electrode section and a second negative electrode section; and
an insulating layer electrically insulating the first negative electrode section of each of the at least one first solid electrolytic capacitor element of the first group from the second negative electrode section of each of the at least one second solid electrolytic capacitor element of the second group,
wherein the first negative electrode section of each of the at least one first solid electrolytic capacitor element of the first group and the second negative electrode section of each of the at least one second solid electrolytic capacitor element of the second group are stacked via the insulating layer, and
wherein the first positive electrode section of each of the at least one first solid electrolytic capacitor element of the first group and the second positive electrode section of each of the at least one second solid electrolytic capacitor element of the second group are disposed on opposite sides of the laminated body with respect to each other
a pair of positive electrode common terminals electrically coupled to the first positive electrode section of each of the at least one first solid electrolytic capacitor element of the first group and the second positive electrode section of each of the at least one second solid electrolytic capacitor element of the second group, respectively;
a first negative electrode common terminal electrically coupled to the first negative electrode section of each of the at least one first solid electrolytic capacitor element of the first group;
a second negative electrode common terminal electrically coupled to the second negative electrode section of each of the at least one second solid electrolytic capacitor element of the second group, and is electrically insulated from the first negative electrode common terminal;
an insulating covering resin covering the laminated body in a state where a part of the positive electrode common terminals and a part of the first and second negative electrode common terminals are exposed; and
an inductor section insulated from the respective negative electrode sections of the at least one first solid electrolytic capacitor elements of the first group and at least one second solid electrolytic capacitor elements of the second group and connecting the pair of positive electrode common terminals, wherein
the insulating layer is one of a first insulating layer and a second insulating layer,
the first insulating layer is disposed on a part exceeding 50% of a surface of the first negative electrode section of each of the at least one first solid electrolytic capacitor element of the first group on an opposite side to the first positive electrode section,
the second insulating layer is disposed on a part exceeding 50% of a surface of the second negative electrode section of each of the at least one second solid electrolytic capacitor element of the second group on an opposite side to the second positive electrode section,
the first negative electrode section of each of the at least one first solid electrolytic capacitor element of the first group has an exposed section that is electrically coupled to the first negative electrode common terminal, and
the second negative electrode section of each of the at least one second solid electrolytic capacitor element of the second group has an exposed section that is electrically coupled to the second negative electrode common terminal.

2. A chip-type solid electrolytic capacitor comprising:
a laminated body including:
a first group formed of at least one first solid electrolytic capacitor element that has a first positive electrode section and a first negative electrode section;
a second group formed of at least one second solid electrolytic capacitor element that has a second positive electrode section and a second negative electrode section; and
an insulating layer electrically insulating the first negative electrode section of each of the at least one first solid electrolytic capacitor element of the first group from the second negative electrode section of each of the at least one second solid electrolytic capacitor element of the second group,
wherein the first negative electrode section of each of the at least one first solid electrolytic capacitor element of the first group and the second negative electrode section of each of the at least one second solid electrolytic capacitor element of the second group are stacked via the insulating layer, and
wherein the first positive electrode section of each of the at least one first solid electrolytic capacitor element of the first group and the second positive electrode section of each of the at least one second solid electrolytic capacitor element of the second group are disposed on opposite sides of the laminated body with respect to each other
a pair of positive electrode common terminals electrically coupled to the first positive electrode section of each of the at least one first solid electrolytic capacitor element of the first group and the second positive electrode section of each of the at least one second solid electrolytic capacitor element of the second group, respectively;
a first negative electrode common terminal electrically coupled to the first negative electrode section of each of the at least one first solid electrolytic capacitor element of the first group;
a second negative electrode common terminal electrically coupled to the second negative electrode section of each of the at least one second solid electrolytic capacitor element of the second group, and electrically insulated from the first negative electrode common terminal; and
an insulating covering resin covering the laminated body in a state where a part of the pair of positive electrode common terminals and a part of the first and second negative electrode common terminals are exposed, wherein
the insulating layer is one of a first insulating layer and a second insulating layer,
the first insulating layer is disposed on a part exceeding 50% of a surface of the first negative electrode section of each of the at least one first solid electrolytic capacitor element of the first group on an opposite side to the first positive electrode section, the second insulating layer is disposed on a part exceeding 50% of a surface of the second negative electrode section of each of the at least one second solid electrolytic capacitor element of the second group on an opposite side to the second positive electrode section, the first negative electrode section of each of the at least one first solid electrolytic capacitor element of the first group has an exposed section that is electrically coupled to the first negative electrode common terminal, and the second negative electrode section of each of the at least one second solid electrolytic capacitor element of the second group has an exposed section that is electrically coupled to the second negative electrode common terminal.

3. The chip-type solid electrolytic capacitor according to claim 2, wherein the at least one first solid electrolytic capacitor element of the first group and the at least one second solid electrolytic capacitor element of the second group are alternately stacked.

4. The chip-type solid electrolytic capacitor according to claim 2, wherein the at least one first solid electrolytic capacitor element of the first group is equal in number to the at least one second solid electrolytic capacitor element of the second group.

5. The chip-type solid electrolytic capacitor according to claim 2, wherein the first group is formed of at least one first element unit and the second group is formed of at least one second element unit, each of the at least one first element unit includes that at least one first solid electrolytic capacitor element of the first group and each of the at least one second element unit includes the at least one second solid electrolytic capacitor element of the second group, and the at least one first element unit and the at least one second element unit are alternately stacked.

6. The chip-type solid electrolytic capacitor according to claim 5, wherein the at least one first element unit is equal in number to the at least one second element unit.

7. The chip-type solid electrolytic capacitor according to claim 2, further comprising:

a first negative electrode lead frame disposed on a lower surface of the laminated body, electrically coupled to the first negative electrode section of each of the at least one first solid electrolytic capacitor element of the first group, and electrically coupled to the first negative electrode common terminal; and a second negative electrode lead frame disposed on the lower surface of the laminated body, electrically coupled to the second negative electrode section of each of the at least one second, solid electrolytic capacitor element of the second group, and electrically insulated from the first negative electrode lead frame.

8. The chip-type solid electrolytic capacitor according to claim 7, wherein the second negative electrode lead frame is bound to an upper surface of the first negative electrode common terminal in an insulated state, and the first negative electrode lead frame is bound to an upper surface of the second negative electrode common terminal in an insulated state.

9. The chip-type solid electrolytic capacitor of claim 2, wherein each of the at least one first solid electrolytic capacitor element and the at least one second solid electrolytic capacitor element are flat solid electrolytic capacitor elements.

* * * * *